(12) United States Patent
Utsumi

(10) Patent No.: US 8,614,515 B2
(45) Date of Patent: Dec. 24, 2013

(54) WIRING METHOD FOR SEMICONDUCTOR INTEGRATED CIRCUIT, SEMICONDUCTOR-CIRCUIT WIRING APPARATUS AND SEMICONDUCTOR INTEGRATED CIRCUIT

(75) Inventor: Tetsuaki Utsumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 13/233,996

(22) Filed: Sep. 15, 2011

(65) Prior Publication Data

US 2012/0161337 A1 Jun. 28, 2012

(30) Foreign Application Priority Data

Dec. 28, 2010 (JP) ................................. 2010-294025

(51) Int. Cl.
*H01L 29/40* (2006.01)
(52) U.S. Cl.
USPC ........... 257/786; 438/118; 438/128; 438/622; 438/639; 257/E23.141; 257/E21.575
(58) Field of Classification Search
USPC .................. 438/622, 639, 118, 128; 257/786, 257/E23.141, E21.575
See application file for complete search history.

(56) References Cited

U.S. PATENT DOCUMENTS

| 5,633,479 | A |   | 5/1997 | Hirano |   |
|---|---|---|---|---|---|
| 5,789,791 | A | * | 8/1998 | Bergemont | 257/401 |
| 5,847,421 | A | * | 12/1998 | Yamaguchi | 257/207 |
| 6,057,225 | A | * | 5/2000 | Yokota | 438/622 |
| 6,247,162 | B1 | * | 6/2001 | Fujine et al. | 716/111 |
| 6,271,548 | B1 | * | 8/2001 | Umemoto et al. | 257/202 |
| 6,274,895 | B1 | * | 8/2001 | Fujii et al. | 257/207 |
| 6,396,150 | B2 | * | 5/2002 | Kohno | 257/758 |
| 6,611,943 | B2 |   | 8/2003 | Shibata et al. |   |
| 6,795,956 | B2 | * | 9/2004 | Hokari | 257/207 |
| 7,076,756 | B2 |   | 7/2006 | Ichimiya |   |
| 7,426,707 | B2 |   | 9/2008 | Ichimiya |   |

(Continued)

FOREIGN PATENT DOCUMENTS

| JP | 2004-158532 A | 6/2004 |
|---|---|---|
| JP | 2005-322785 A | 11/2005 |

(Continued)

OTHER PUBLICATIONS

U.S. Appl. No. 13/420,945, filed Mar. 15, 2012, Utsumi et al.

*Primary Examiner* — N Drew Richards
*Assistant Examiner* — Ankush Singal
(74) *Attorney, Agent, or Firm* — Knobbe, Martens, Olson & Bear LLP

(57) ABSTRACT

A wiring method for a semiconductor integrated circuit has the steps of, separately from a first layer on which a first signal wiring pattern is mainly formed, laying out a first power-supply wiring pattern on a second layer so that a plurality of rows of the first power-supply wiring pattern are regularly arranged with vacant areas each interposed between the rows and making narrower a width of each vacant area than a narrowest width of a row among the rows of the first power-supply wiring pattern, and laying out a second signal wiring pattern electrically conductive to the first layer in two or more rows of the vacant areas on the second layer so that the second signal wiring pattern is not in contact with adjacent rows of the first power-supply wiring pattern on both sides.

20 Claims, 5 Drawing Sheets

(56) References Cited

U.S. PATENT DOCUMENTS

| | | | |
|---|---|---|---|
| 7,500,211 B2 | 3/2009 | Komaki | |
| 7,501,689 B2 | 3/2009 | Yoshida et al. | |
| 7,505,285 B2* | 3/2009 | Osaka | 361/788 |
| 7,523,436 B2 | 4/2009 | Mizuno et al. | |
| 7,692,942 B2* | 4/2010 | Oosaka | 365/51 |
| 7,694,260 B2 | 4/2010 | Tamiya | |
| 7,719,115 B2 | 5/2010 | Seta | |
| 7,800,136 B2 | 9/2010 | Shiga | |
| 7,956,647 B2* | 6/2011 | Katoh | 326/93 |
| 7,989,849 B2 | 8/2011 | Sherleker et al. | |
| 8,171,441 B2* | 5/2012 | McElvain et al. | 716/115 |
| 8,193,608 B2* | 6/2012 | Yabu et al. | 257/565 |
| 8,413,100 B2 | 4/2013 | Chuang | |
| 2001/0054721 A1* | 12/2001 | Takayama | 257/211 |
| 2002/0074660 A1* | 6/2002 | Fukasawa | 257/758 |
| 2004/0065961 A1* | 4/2004 | Funakoshi et al. | 257/774 |
| 2004/0133868 A1 | 7/2004 | Ichimiya | |
| 2004/0205685 A1* | 10/2004 | Takeda | 716/12 |
| 2005/0050502 A1 | 3/2005 | Kurihara et al. | |
| 2006/0214280 A1* | 9/2006 | Mizuno et al. | 257/692 |
| 2006/0218519 A1 | 9/2006 | Ichimiya | |
| 2007/0033562 A1 | 2/2007 | Correale et al. | |
| 2008/0048318 A1* | 2/2008 | Sakurabayashi | 257/737 |
| 2008/0054307 A1 | 3/2008 | Shimizu | |
| 2008/0246160 A1* | 10/2008 | Ozoe et al. | 257/773 |
| 2009/0031267 A1* | 1/2009 | Ueki | 716/5 |
| 2009/0064066 A1 | 3/2009 | Kurihara et al. | |
| 2009/0166894 A1* | 7/2009 | Azumai | 257/786 |
| 2009/0321791 A1 | 12/2009 | Wagner | |
| 2010/0122230 A1 | 5/2010 | Qiu | |
| 2010/0177127 A1* | 7/2010 | Akiyama et al. | |
| 2010/0237508 A1 | 9/2010 | Utsumi | |
| 2011/0012960 A1* | 1/2011 | Sakuma et al. | 347/44 |
| 2011/0037754 A1* | 2/2011 | Kobashi et al. | 345/211 |
| 2011/0254066 A1* | 10/2011 | Miura | 257/296 |
| 2011/0294263 A1* | 12/2011 | Ogawa et al. | 438/113 |
| 2012/0235241 A1 | 9/2012 | Barrow | |

FOREIGN PATENT DOCUMENTS

| | | |
|---|---|---|
| JP | 2006-244080 A | 9/2006 |
| JP | 2008-066371 | 3/2008 |
| JP | 2008-310527 A | 12/2008 |
| JP | 2010-219332 | 9/2010 |

* cited by examiner

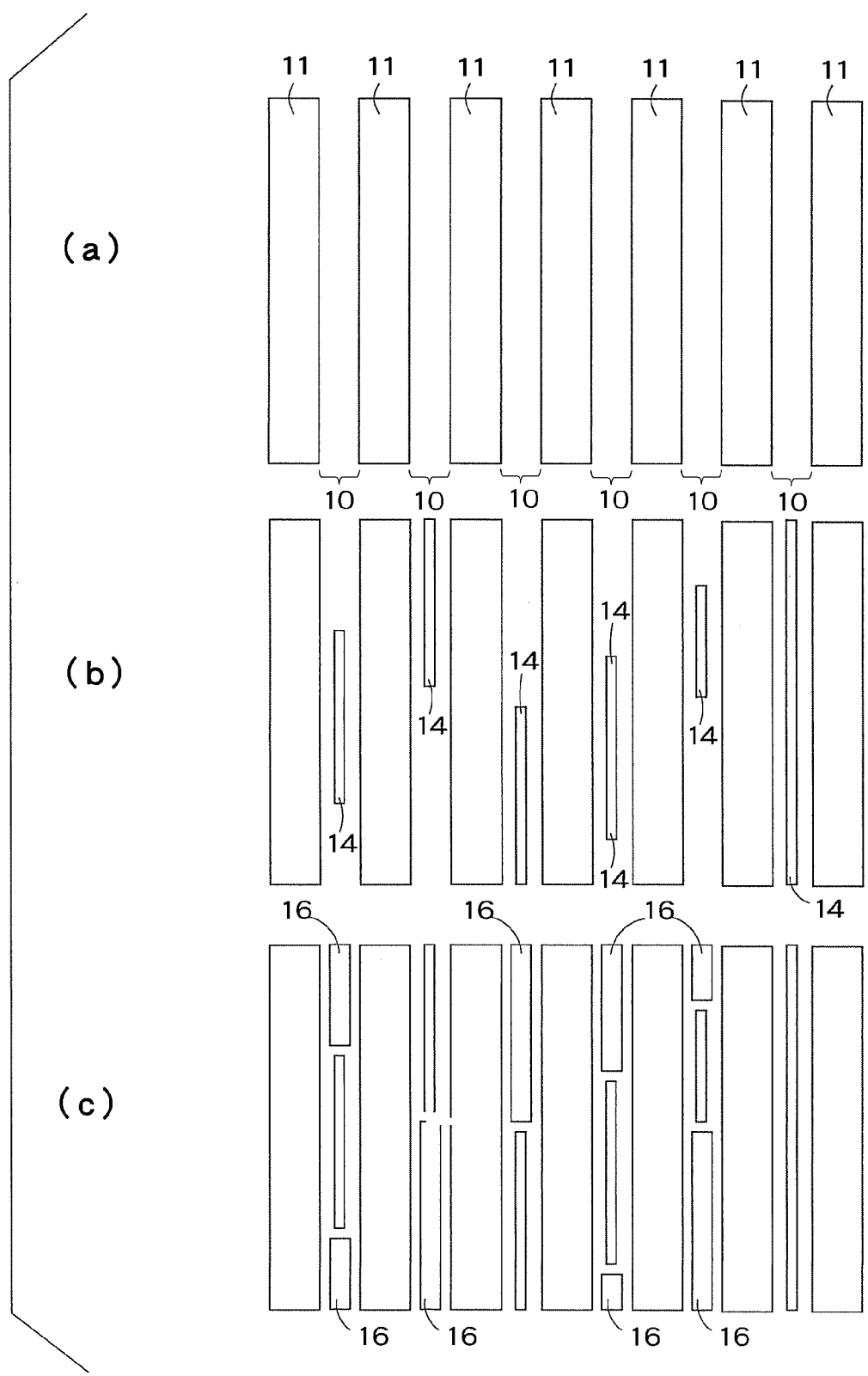
F I G. 3

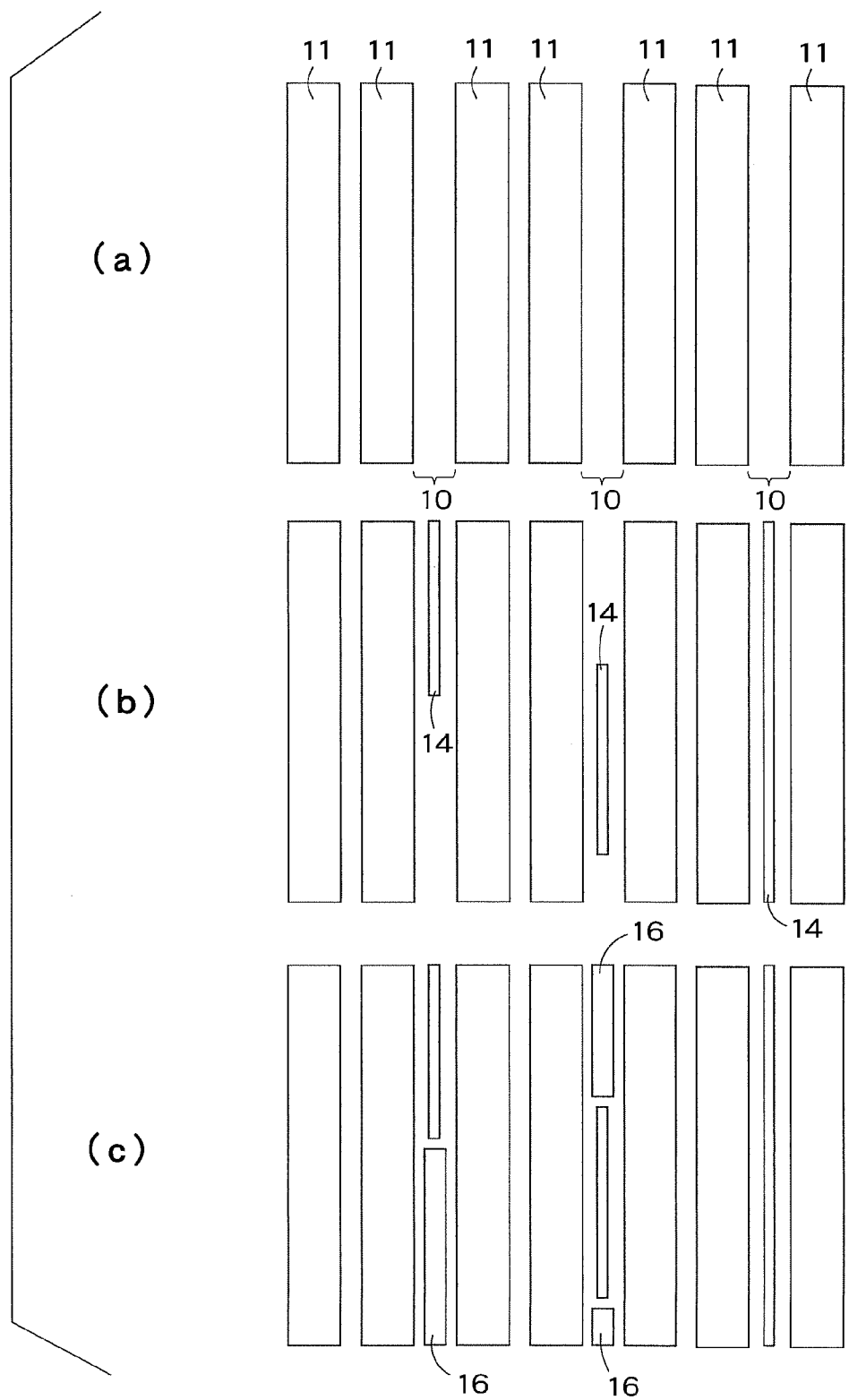
F I G. 5

WIRING METHOD FOR SEMICONDUCTOR INTEGRATED CIRCUIT, SEMICONDUCTOR-CIRCUIT WIRING APPARATUS AND SEMICONDUCTOR INTEGRATED CIRCUIT

CROSS REFERENCE TO RELATED APPLICATIONS

This application is based upon and claims the benefit of priority from the prior Japanese Patent Application No. 2010-294025, filed on Dec. 28, 2010, the entire contents of which are incorporated herein by reference.

FIELD

The present embodiments relate to a wiring method for a semiconductor integrated circuit, a semiconductor-circuit wiring apparatus, and a semiconductor integrated circuit in which signal wiring patterns and power-supply wiring patterns are arranged by using a plurality of layers.

BACKGROUND

With the advancement of wiring miniaturization for integrated circuits and the increase in wiring resistance and parasitic capacitance due to the wiring miniaturization, a signal propagation delay and its variation are increased, thereby making timing design furthermore difficult. Under such a background, a technique for improving timing is widely used in which a signal speed is increased by shortening the signal propagation delay of specific wirings using a thick-film wiring layer which has low wiring resistance and is formed above a wiring layer.

When this technique is applied, a thick-film wiring layer is required for signal wirings. In addition, it is preferable to lay out as many power-supply wirings as possible on the thick-film wiring layer so as to lower the impedance of a power-supply wiring network for the purpose of restricting voltage drop (IR drop) of a power-supply voltage due to the wiring resistance.

Notwithstanding, if separate thick-film wiring layers are prepared for signal wirings and power-supply wirings, respectively, an additional device structure is required, which results in higher fabrication cost and longer term for design changes. Therefore, as far as the voltage drop due to wiring resistance is within an allowable range, it is preferable to share the common thick-film wiring layer with both of signal wirings and power-supply wirings.

In a general design process for digital integrated circuits, power-supply wirings are laid out first and then ordinary signal wirings are laid out. Upon designing a digital integrated circuit in accordance with this order of steps, if power-supply wirings are laid out on the entire surface of a thick-film wiring layer first, signal wirings cannot be laid out on the wiring layer. If a portion of the thick-film wiring layer is preliminarily reserved as a space for signal wirings, the impedance of a power-supply wiring network increases compared to when no such space is provided and a power-supply voltage drops significantly due to wiring resistance, which cause malfunction of a semiconductor integrated circuit.

Different from the technique described above, there is also proposed a technique in which a voltage drop due to wiring resistance is restricted by conducting additional power-supply wirings after the signal wirings. However, even if this technique is applied without any technical artifice, it is impossible to restrict the voltage drop so much, but it takes much working load, because a space for conducting the additional power-supply wirings is limited.

BRIEF DESCRIPTION OF THE DRAWINGS

FIG. 3 is a plan view showing an example of a semiconductor integrated circuit fabricated in accordance with the flowchart of FIG. 2;

FIG. 5 is a plan view showing a modification to FIG. 3; and

DETAILED DESCRIPTION

Embodiments will now be explained with reference to the accompanying drawings.

A wiring method for a semiconductor integrated circuit is provided as follows. Separately from a first layer on which a first signal wiring pattern is mainly formed, a plurality of rows of first power-supply wiring patterns with vacant areas each interposed between rows on a second layer is regularly laid out by using a semiconductor-circuit wiring apparatus. A width of each vacant area is set to be narrower than a length adding a narrowest width among widths of the rows of the power-supply wiring patterns to twice a minimum spacing in the design rule for the second layer, and to be wider than a length adding the minimum spacing in the design rule for the second layer to twice the minimum spacing in the design rule for the second layers. A second signal wiring pattern electrically conductive to the first layer in two or more rows of the vacant areas on the second layer is laid out by using a semiconductor-circuit wiring apparatus so that the second signal wiring pattern is not in contact with adjacent rows of the first power-supply wiring patterns on both sides. A second power-supply wiring pattern is further laid out in at least a portion of a pattern-layout allowable area remaining in the vacant areas by using a semiconductor-circuit wiring apparatus.

Figure 1:
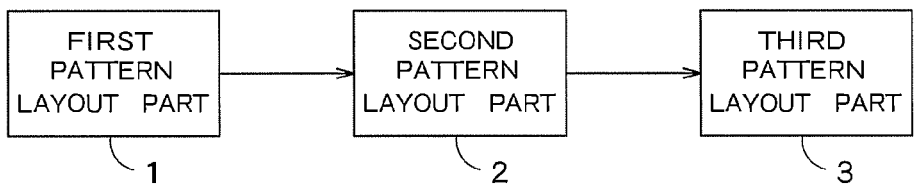
FIG. 1 is a block diagram schematically showing the configuration of a semiconductor-circuit wiring apparatus according to an embodiment.

FIG. 1 is a block diagram schematically showing the configuration of a semiconductor-circuit wiring apparatus according to an embodiment. The semiconductor-circuit wiring apparatus of FIG. 1 is to lay out signal wiring patterns and power-supply wiring patterns on first and second layers of a semiconductor integrated circuit. Provided mainly on the first layer are the signal wiring patterns. However, the power-supply wiring pattern can also be provided on the first layer. The second layer is provided above the first layer, for example. Provided mainly on the first layer are the power-supply wiring patterns. This embodiment assumes that both of the power and signal wiring patterns provided on the second layer. The second layer is, for example, formed by using a thick-film wiring layer. Otherwise, any other layer other than the thick-film wiring layer can be used as the second layer.

The layer structure of the semiconductor integrated circuit may not necessarily be limited to a dual-layer structure of the first and second layers described above. For example, the layer on which the signal wiring patterns are mainly formed may be separated into a plurality of layers, in addition to the first layer. Moreover, the layer on which the power-supply wiring patterns are mainly formed may be separated into a plurality of layers, in addition to the second layer. An example explained below is that a semiconductor integrated circuit has a dual-layer structure of the first and second layers, for simplicity.

The semiconductor-circuit wiring apparatus of FIG. 1 has a first pattern layout part 1, a second pattern layout part 2, and a third pattern layout part 3. At least a portion of the first to third pattern layout parts 1 to 3 may be configured with hardware or software. If it is configured with software, a computer runs software to perform the processes of the first to third pattern layout parts 1 to 3. In this case, a single computer may perform the processes of the first to third pattern layout parts 1 to 3. Or a plurality of computers may separately perform the processes of the first to third pattern layout parts 1 to 3.

The first pattern layout part 1 regularly arranges a plurality of rows of power-supply wiring patterns on the second layer. Adjacent two rows of the power-supply wiring patterns are arranged having a vacant area interposed therebetween. The width of each vacant area is set to be narrower than a length adding the narrowest width among widths of the rows of the power-supply wiring patterns to twice the minimum spacing in the design rule for the second layer, and to be wider than a length adding the minimum spacing in the design rule for the second layer to twice the minimum spacing in the design rule for the second layers. Here, the term "regularly" means that the rows of the power-supply wiring patterns that extend in one direction and the rows of vacant areas that extend in the same one direction are arranged alternately. The widths of rows of the vacant areas may not necessarily be equal to one another. Likewise, the widths of the rows of the power-supply wiring patterns may not necessarily be equal to one another.

The reason why the width of each vacant area is set to be narrower than the length adding the narrowest width among widths of the rows of the power-supply wiring patterns to twice the minimum spacing in the design rule for the second layer, and to be wider than a length adding the minimum spacing in the design rule for the second layer to twice the minimum spacing in the design rule for the second layers is to avoid that the density of the power-supply wiring pattern on the second layer becomes lower more than necessary. This embodiment assumes that the second layer is shared by the power and signal wiring patterns. However, if the width of the vacant area described above is wide, although the signal wiring pattern can be laid out, the wiring resistance of the power-supply wiring pattern becomes higher and the power-supply voltage drops significantly. Accordingly, in this embodiment, the width of the vacant area is restricted within the above-described range.

The second pattern layout part 2 lays out the signal wiring patterns in two or more rows of vacant areas. The signal wiring patterns are laid out in the vacant areas so as not to contact the power-supply wiring patterns on both sides. Moreover, since the width of each vacant area is smaller than the smallest width of the power-supply wiring patterns, the width of the signal wiring patterns is also smaller than the smallest width of the power-supply wiring patterns.

Accordingly, on the second layer, the width of the signal wiring patterns becomes narrower than that of each row of the power-supply wiring patterns laid out in advance. However, the second layer is provided with the vacant areas of the number depending on the number of rows of the power-supply wiring patterns. Therefore, even though each row of the signal wiring patterns is narrow, it is possible to attain high density for the signal wiring patterns on the second layer to a certain degree.

The third pattern layout part 3 further lays out power-supply wiring patterns in pattern-layout allowable areas remaining in the vacant areas on the second layer after laying out the signal wiring patterns in the vacant areas. The width of the power-supply wiring patterns laid out by the third pattern layout part 3 is narrower than that of each row of the power-supply wiring patterns laid out by the first pattern layout part 1.

In some cases, the power-supply wiring pattern laid out by the third pattern layout part 3 may be in contact with the power-supply wiring patterns on both sides. This widens the power-supply wiring pattern. However, the power-supply wiring pattern should not be in contact with the power-supply wiring patterns on both sides having different voltages (ground).

Figure 2:
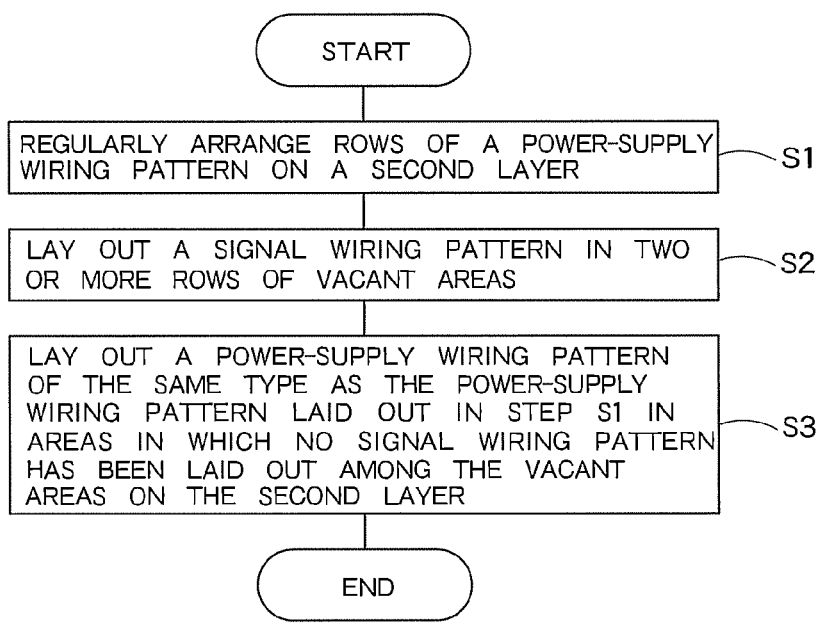
FIG. 2 is a flowchart showing an example of the operation of the semiconductor-circuit wiring apparatus of FIG. 1.

FIG. 2 is a flowchart showing an example of the operation of the semiconductor-circuit wiring apparatus of FIG. 1. As described above, this flowchart may be executed by software running on a computer. Or the flowchart of FIG. 2 may be executed by hardware having the first to third pattern layout parts 1 to 3 shown in FIG. 1.

Figure 4:
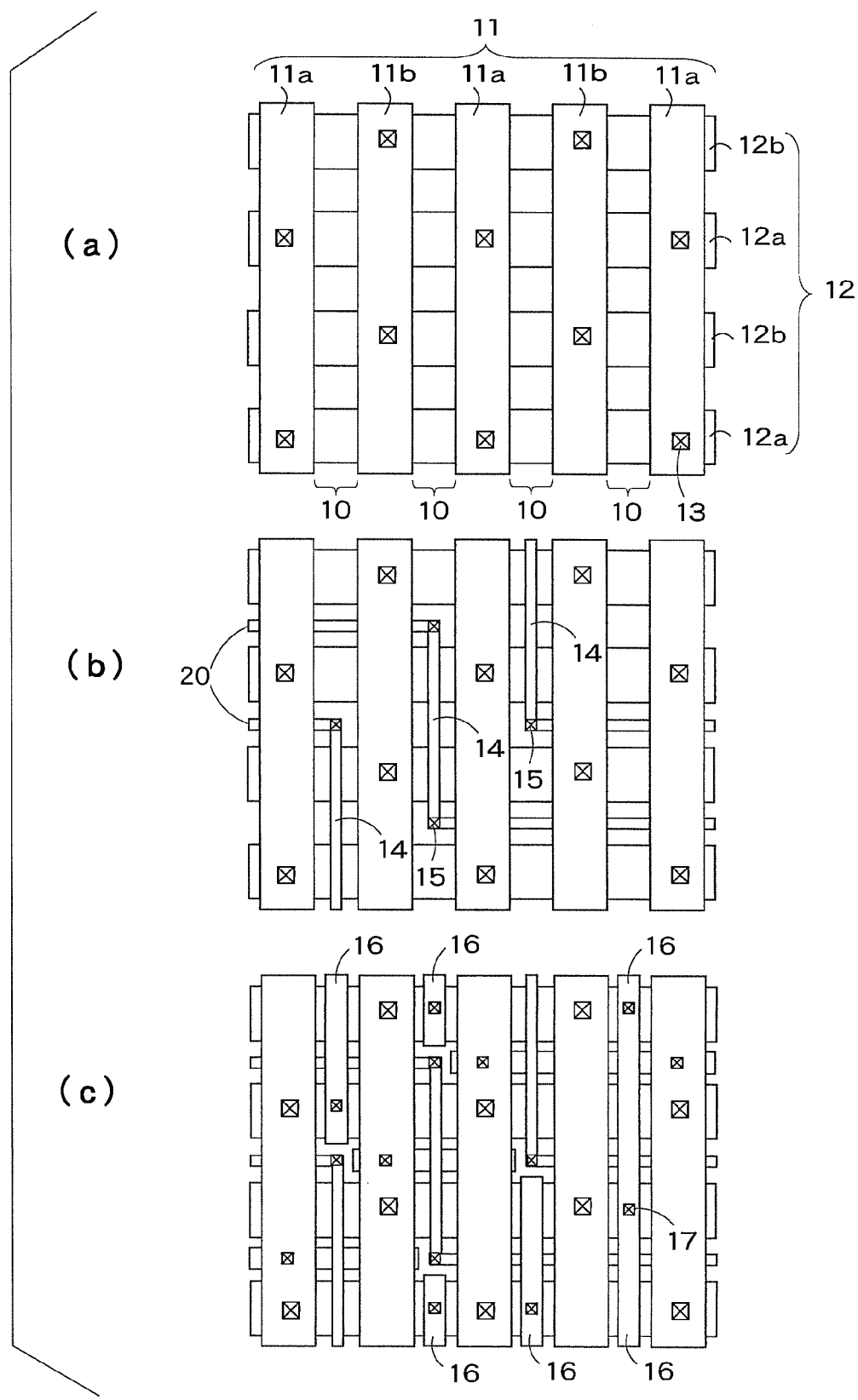
FIG. 4 is a plan view showing an example different from FIG. 3.

FIGS. 3 and 4 are plan views showing examples of a semiconductor integrated circuit fabricated in accordance with the flowchart of FIG. 2. In FIGS. 3 and 4, power-supply wiring patterns 11 laid out on the second layer are drawn as rows extending in the longitudinal direction. In FIG. 4, the pattern extending in the lateral direction is also drawn, which is a power-supply wiring pattern 12 to be formed beneath the first layer.

The wiring patterns of FIGS. 3 and 4 are different from each other with no relations. The operation of the semiconductor-circuit wiring apparatus according to the present embodiment will be explained hereinbelow with reference to FIGS. 2 to 3. It is assumed that before the flowchart of FIG. 2 is started, the layout of a signal wiring pattern 20 on the first layer has already been completed. The power-supply wiring pattern 11 may also be formed on the first layer.

Firstly, the first pattern layout part 1 regularly arranges a plurality of rows of the power-supply wiring patterns on the second layer (step S1, FIGS. 3(a) and 4(a)). Each width of vacant areas 10 between adjacent rows of the power-supply wiring patterns 11 is made to be narrower than the narrowest width among widths of the rows of the power-supply wiring patterns 11.

Step S1 will be explained more in detail hereinbelow. Shown in FIGS. 3(a) and 4(a) are examples in which the rows of the power-supply wiring patterns 11 have the same width. However, as described above, the rows of the power-supply wiring patterns 11 may not necessarily have the same width. Therefore, in step S1, the width of each vacant area 10 is made to be narrower than a length adding the narrowest width among widths of the rows of the power-supply wiring patterns 11 to twice the minimum spacing in the design rule for the second layer, and to be wider than a length adding the minimum spacing in the design rule for the second layer to twice the minimum spacing in the design rule for the second layers even if all of the rows have different widths. By doing so, it is possible to increase the density of the power-supply wiring patterns 11 on the second layer and to restrict the power-supply voltage drop due to wiring resistance.

The type of the power-supply wiring patterns 11 is not necessarily the same one. For example, as shown in FIG. 4(a), two types of patterns, a power-supply voltage (VDCC) pattern 11a and a ground (VSSC) pattern 11b, may be laid out alternately. However, this is just an example. A layer for laying out the power-supply voltage patterns may be provided separate from a layer for laying out the ground pattern, and plurality of rows of wiring patterns may be laid out on each layer with the vacant areas 10 therebetween. Or either the power-supply voltage patterns or the ground patterns may be laid out as shown in FIG. 3(a) or 4(a).

The power-supply wiring patterns 11 laid out on the second layer have to be electrically conductive to a power-supply wiring patterns on another layer or power terminals. Therefore, there are contacts 13 for connecting the power-supply wiring patterns 11 to another layer, according to need. In the examples of FIG. 4, there are power-supply voltage (VDCC) patterns and a ground (VSSC) patterns arranged alternately on a layer provided beneath the first layer. Therefore, as shown in FIG. 4(b), the contacts 13 are provided at the intersections of these patterns and the power-supply voltage and ground patterns 11a and 11b of the second layer, according to need, so that the patterns on the other layer provided beneath the first layer become conductive to the power-supply voltage and ground patterns 11a and 11b, respectively.

When step S1 is completed, the second pattern layout part 2 lays out a signal wiring pattern 14 in one of at least two rows of vacant areas 10 provided in step S1 (step S2, FIGS. 3(b) and 4(b)). Here, as shown in FIGS. 3(b) and 4(b), each row of the signal wiring patterns 14 is laid out in a vacant area 10 so as not to be in contact with the adjacent rows of the power-supply wiring pattern 11. There is no particular restriction to the pattern lengths of the signal wiring patterns 14. That is, the signal wiring pattern 14 may be provided in a portion of the vacant areas 10.

Contacts 15 are then provided on the signal wiring pattern 14 of the second layer so that the signal wiring pattern 14 becomes electrically conductive to the signal wiring pattern 20 of the first layer. The locations of the contacts 15 depend on their relations to the first layer, hence the signal wiring pattern 14 is formed on the second layer in accordance with the locations of the contacts 15. For example, in FIG. 4(b), there are the signal wiring patterns 20 that extend laterally on the first layer. In order to electrically conduct the signal wiring pattern 14 with the signal wiring patterns 20, the contacts 15 are provided on the intersections of the signal wiring pattern 20 and the signal wiring pattern 14 so as to extend longitudinally on the second layer.

The larger the number of rows of the power-supply wiring patterns 11 laid out in step S1 is, the larger the number of rows for the vacant areas 10 becomes, and as a result, it is possible to increase the number of the rows of the signal wiring patterns 14 capable of being laid out in step S2. This indicates that it is possible to further increase the density of the signal wiring patterns 14, thereby reducing signal propagation delay and improving electrical property of a semiconductor integrated circuit.

This embodiment assumes that the signal wiring patterns 14 are laid out in two or more rows of the vacant areas 10 each between the rows of the power-supply wiring patterns 11 on the second layer. However, the rows of the signal wiring patterns 14 on the second layer may be patterns of the same signal or different signals. That is, there is no restriction to the signal type of the signal wiring patterns 14 laid out on the second layer. As one example, it is assumed to lay out on the second layer the signal wiring pattern 14 regarding signals which have to restrict the voltage drop due to the wiring resistance of signal wirings by using the second layer (for example, various kinds of control signals or critical signals) or signals having low margin to the signal delay (for example, clock signals).

When step S2 of FIG. 2 is completed, the third pattern layout part 3 lays out a power-supply wiring pattern 16 of the same type as the power-supply wiring pattern 11 laid out in step S1 in areas in which no signal wiring pattern 14 has been laid out among the vacant areas 10 on the second layer (step S3, FIG. 3(c)).

The reason for providing step S3 is as follows. By providing the second layer with the vacant areas 10 in step S1, the density of the power-supply wiring pattern 11 on the second layer decreases. Therefore, in order to increase the density of the power-supply wiring pattern 11 even if a little bit, as many power-supply wiring patterns 16 as possible are laid out by effectively using the vacant areas 10.

In step S3, the power-supply wiring patterns 16 are laid out so as to be dispersed in the vacant areas 10. Each of the power-supply wiring patterns 16 has to be electrically conductive to another layer. Therefore, the contact 17 is formed according to need. Moreover, in some cases, the power-supply wiring patterns 16 may be laid out to be in contact with the adjacent power-supply wiring pattern 11 to widen the wiring width.

Like step S1, the power-supply wiring patterns 16 laid out in step S3 is not necessarily be one type of power-supply voltage patterns. The power-supply wiring patterns 16 for power-supply voltage and ground voltage may be separately laid out in different vacant areas 10. Or separate power-supply wiring patterns 16 of different types may be laid out in the same vacant area 10 so that they are not in contact with each other.

As described above, in this embodiment, a plurality of rows of the power-supply wiring patterns 11 are regularly laid out on the second layer, with the vacant area 10 interposed between adjacent two rows, and the width of each vacant area 10 is set to be narrower than a length adding the narrowest width among widths of the rows of the power-supply wiring pattern 11 to twice the minimum spacing in the design rule for the second layer, and to be wider than a length adding the minimum spacing in the design rule for the second layer to twice the minimum spacing in the design rule for the second layers. Thereafter, the signal wiring pattern 14 is laid out in the vacant areas 10. If there are remaining vacant areas 10, the power-supply wiring pattern 16 is provided further in the remaining vacant areas 10. In this way, the second layer can be shared by the signal wiring pattern and the power-supply wiring pattern, and it is possible to restrict the voltage drop due to the wiring resistance of the signal wiring patterns and the power-supply wiring patterns, thereby fabricating the semiconductor integrated circuit having excellent electrical property.

In FIGS. 3 and 4, the examples have been explained in which each row of the power-supply wiring patterns 16 is provided with one vacant area 10 capable of laying out the signal wiring pattern 14. It is, however, not necessary to provide one vacant area 10 for each row of the power-supply wiring pattern 16. For example, one vacant area 10 capable of laying out the signal wiring pattern 14 may be provided for a plurality of rows of the power-supply wiring pattern 16.

Figure 6:
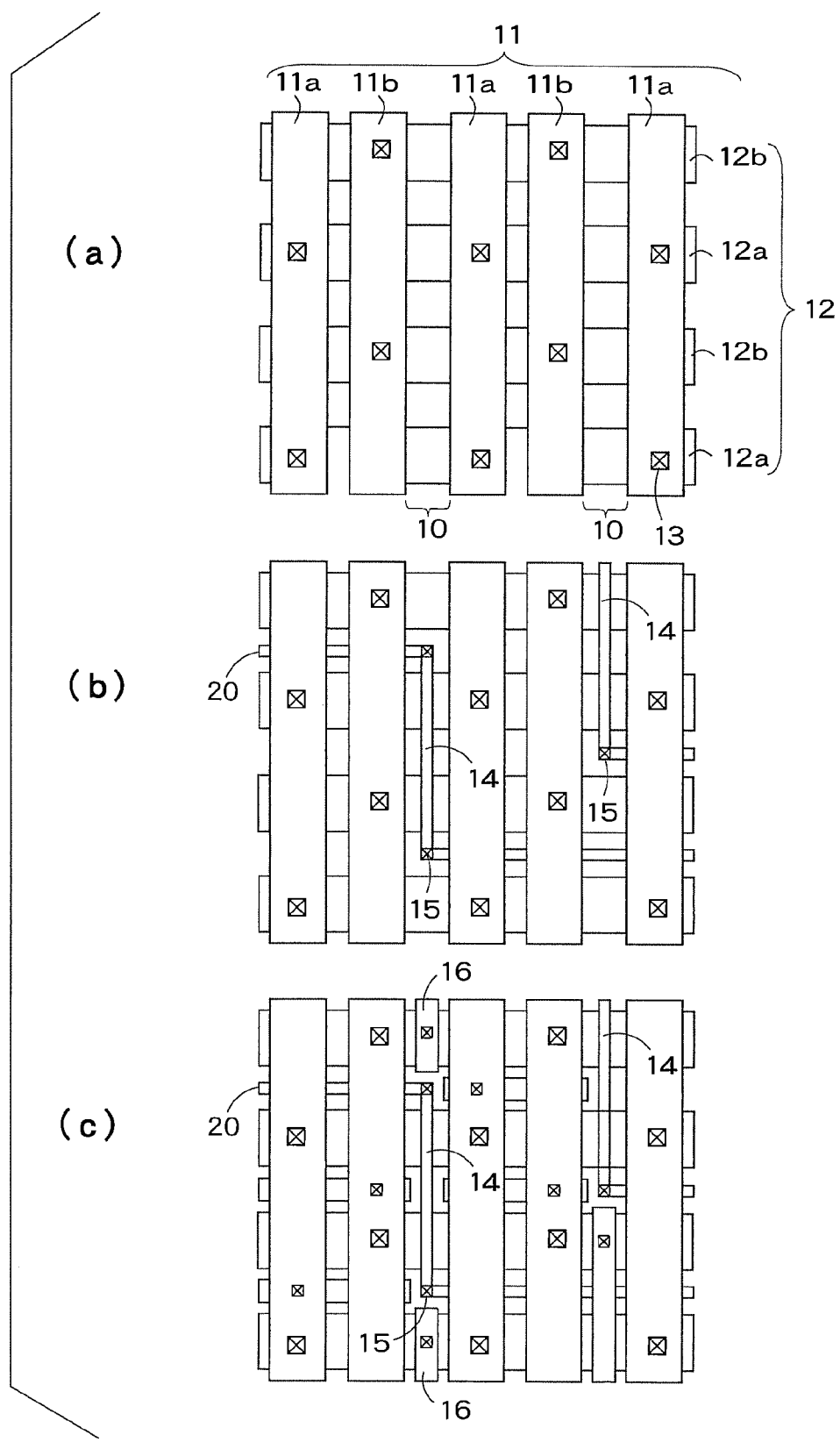
FIG. 6 is a plan view showing a modification to FIG. 4.

For example, FIGS. 5 and 6 show examples in which one vacant area 10 capable of laying out the signal wiring pattern 14 is provided for two rows of the power-supply wiring pattern 16. FIGS. 5 and 6 are plan views corresponding to FIGS. 3 and 4, respectively. In both of FIGS. 5 and 6, the second layer can be shared by the signal wiring pattern 14 and the power-supply wiring pattern 16.

At least part of the semiconductor-circuit wiring apparatus explained in the embodiment may be configured with hardware or software. When it is configured with software, a program that performs at least part of the functions of the semiconductor-circuit wiring apparatus may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Moreover, a program that achieves the functions of at least part of the semiconductor-circuit wiring apparatus may be distributed via a communication network (including wireless communication) such as the Internet. The program may also be distributed via an online network such as the Internet or a wireless network, or stored in a storage medium and distributed under the condition that the program is encrypted, modulated or compressed.

The embodiment of the present invention is not limited to the respective embodiments described above but includes a variety of modifications conceivable by parsons skilled in the art. The advantages of the present invention are also not limited to those explained above. Accordingly, various addition, changes, and partial omissions may be made without departing from the scope and spirit of the inventions derived from the accompanying claims and their equivalents.

The invention claimed is:

1. A wiring method for a semiconductor integrated circuit comprising:
separately from a first layer on which a first signal wiring pattern is formed, regularly laying out a plurality of rows of first power-supply wiring patterns with vacant areas each interposed between rows on a second layer by using a semiconductor-circuit wiring apparatus;
laying out a second signal wiring pattern electrically conductive to the first layer in two or more rows of the vacant areas on the second layer by using a semiconductor-circuit wiring apparatus so that the second signal wiring pattern is not in contact with adjacent rows of the first power-supply wiring patterns on both sides; and
laying out a second power-supply wiring pattern further in at least a portion of a pattern-layout allowable area remaining in the vacant areas by using a semiconductor-circuit wiring apparatus.

2. The method of claim 1, wherein in the laying out the second signal wiring pattern and the laying out the second power-supply wiring pattern further, only the second signal wiring pattern is, only the second power-supply wiring pattern is, or both of the second signal and power-supply wiring patterns are laid out in the vacant areas between the rows of the first power-supply wiring patterns.

3. The method of claim 1, wherein the second layer is a thick-film wiring layer laid out above the first layer.

4. The method of claim 1, wherein adjacent two rows among the rows of the first power-supply wiring patterns are used for power-supply voltages different from each other.

5. The method of claim 1, wherein either the second signal wiring pattern or the second power-supply wiring pattern laid out in each vacant area is provided with a contact electrically conductive to another layer.

6. The method of claim 1, wherein each vacant area is provided for two or more of the rows of the first power-supply wiring patterns.

7. The method of claim 1, wherein the second power-supply wiring pattern is formed to be in contact with at least one of two rows of the first power-supply wiring patterns laid out on both sides.

8. The wiring method of claim 1, wherein the width of each vacant area is set to be narrower than a length adding a narrowest width among widths of the rows of the power-supply wiring patterns to twice a minimum spacing in the design rule for the second layer, and to be wider than a length adding the minimum spacing in the design rule for the second layer to twice the minimum spacing in the design rule for the second layers.

9. A semiconductor-circuit wiring apparatus comprising:
a first pattern layout part configured to, separately from a first layer on which a first signal wiring pattern is formed, regularly lay out a plurality of rows of first power-supply wiring patterns with vacant areas each interposed between rows on a second layer;
a second pattern layout part configured to lay out a second signal wiring pattern electrically conductive to the first layer in two or more rows of the vacant areas on the second layer so that the second signal wiring pattern is not in contact with adjacent rows of the first power-supply wiring pattern on both sides; and
a third pattern layout part configured to lay out a second power-supply wiring pattern further in at least a portion of a pattern-layout allowable area remaining in the vacant areas.

10. The apparatus of claim 9, wherein the second and third pattern layout parts lay out only the second signal wiring pattern, only the second power-supply wiring pattern, or both of the second signal and power-supply wiring patterns in the vacant areas between the rows of the first power-supply wiring patterns.

11. The apparatus of claim 9, wherein the second layer is a thick-film wiring layer laid out above the first layer.

12. The apparatus of claim 9, wherein adjacent two rows among the rows of the first power-supply wiring patterns are used for power-supply voltages different from each other.

13. The apparatus of claim 9, wherein the first pattern layout part sets the width of each vacant area to be narrower than a length adding a narrowest width among widths of the rows of the power-supply wiring patterns to twice a minimum spacing in the design rule for the second layer, and to be wider than a length adding the minimum spacing in the design rule for the second layer to twice the minimum spacing in the design rule for the second layers.

14. A semiconductor integrated circuit comprising:
a first layer on which first signal wiring patterns are formed; and
a second layer provided above or beneath the first layer, on which first power-supply wiring patterns are formed, the first power-supply wiring patterns are laid out on the second layer so that a plurality of rows of the first power-supply wiring pattern are regularly laid out with gaps each interposed between the rows;
a second signal wiring pattern electrically conductive to the first layer configured to be laid out in two or more rows of the gaps on the second layer so that the second signal wiring pattern is not in contact with adjacent rows of the first power-supply wiring patterns on both sides; and
a second power-supply wiring pattern in addition to the second signal wiring pattern configured to be laid out further in at least in the gaps of the second layer.

15. The circuit of claim 14, wherein the second layer is a thick-film wiring layer laid out above the first layer.

16. The circuit of claim 14, wherein adjacent two rows among the rows of the first power-supply wiring patterns are used for power-supply voltages different from each other.

17. The circuit of claim 14, wherein either the second signal wiring pattern or the second power-supply wiring pattern laid out in each gap is provided with a contact electrically conductive to another layer.

18. The circuit of claim 14, wherein each gap is provided for two or more of the rows of the first power-supply wiring patterns.

19. The circuit of claim 14, wherein the second power-supply wiring pattern is in contact with at least one of two rows of the first power-supply wiring patterns laid out on both sides of the second power-supply wiring pattern.

20. The apparatus of claim 14, wherein the width of each gap is set to be narrower than a length adding a narrowest width among widths of the rows of the power-supply wiring patterns to twice a minimum spacing in the design rule for the second layer, and to be wider than a length adding the minimum spacing in the design rule for the second layer to twice the minimum spacing in the design rule for the second layers.

* * * * *